(12) United States Patent
Tan et al.

(10) Patent No.: US 8,208,530 B2
(45) Date of Patent: Jun. 26, 2012

(54) APPARATUS AND METHOD FOR CORRECTING IQ IMBALANCE

(75) Inventors: Loke Tan, Newport Coast, CA (US); Hanli Zou, Irvine, CA (US); William Ngai, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1702 days.

(21) Appl. No.: 11/334,628

(22) Filed: Jan. 19, 2006

(65) Prior Publication Data

US 2006/0203901 A1   Sep. 14, 2006

Related U.S. Application Data

(60) Provisional application No. 60/661,165, filed on Mar. 14, 2005.

(51) Int. Cl.
*H03K 5/159* (2006.01)
(52) U.S. Cl. ......... 375/235; 375/233; 375/230; 375/326
(58) Field of Classification Search .......... 375/235, 375/233, 350, 142, 136, 144, 149, 326, 340; 333/18, 28; 381/103; 708/323
See application file for complete search history.

(56) References Cited

U.S. PATENT DOCUMENTS

| | | | |
|---|---|---|---|
| 5,105,195 A * | 4/1992 | Conrad | 342/174 |
| 5,754,591 A * | 5/1998 | Samueli et al. | 375/235 |
| 6,442,217 B1 | 8/2002 | Cochran | |
| 6,661,852 B1 | 12/2003 | Genrich | |
| 6,987,815 B2 | 1/2006 | Denno | |
| 7,130,359 B2 * | 10/2006 | Rahman | 375/316 |
| 7,158,586 B2 * | 1/2007 | Husted | 375/324 |
| 7,173,988 B2 * | 2/2007 | Cochran et al. | 375/346 |
| 7,310,387 B2 * | 12/2007 | Kim et al. | 375/316 |
| 7,570,923 B2 * | 8/2009 | Kiss et al. | 455/67.14 |
| 7,653,164 B2 * | 1/2010 | Lin et al. | 375/350 |
| 2002/0057752 A1 | 5/2002 | Denno | |

(Continued)

FOREIGN PATENT DOCUMENTS

WO    WO 94/26067    11/1994

(Continued)

OTHER PUBLICATIONS

Jian Lin et al ("Joint Adaptive Transmitter/Receiver IQ imbalance Correction for OFDM Systems", Communication-Technology Lab, Corporate Technology Group Intel, Santa Clara, 2004).*
European Search Report dated Dec. 4, 2008.

*Primary Examiner* — Shuwang Liu
*Assistant Examiner* — Helene Tayong
(74) *Attorney, Agent, or Firm* — Sterne, Kessler, Goldstein & Fox P.L.L.C.

(57) ABSTRACT

An apparatus and method for correcting IQ imbalance are presented. An exemplary receiver for processing I and Q signals from a tuner includes: a non-decision directed (NDD) imbalance canceller coupled to receive the I and Q signals, and a decision directed (DD) imbalance canceller coupled to the non-decision directed imbalance canceller. The DD imbalance canceller converges after the NDD imbalance canceller converges, so as to correct IQ imbalances in the receiver. An exemplary method for processing I and Q signals from a tuner includes: (a) converging a NDD imbalance canceller to correct a majority of IQ imbalances, and (b) subsequently converging a DD imbalance canceller to correct a remainder of IQ imbalances not corrected in step (a). The apparatus and method correct frequency-dependent and frequency-independent IQ imbalances.

24 Claims, 11 Drawing Sheets

U.S. PATENT DOCUMENTS

| | | | |
|---|---|---|---|
| 2003/0007574 A1* | 1/2003 | Li et al. | 375/316 |
| 2003/0174016 A1 | 9/2003 | Meyer | |
| 2003/0206603 A1* | 11/2003 | Husted | 375/324 |
| 2003/0231726 A1* | 12/2003 | Schuchert et al. | 375/350 |
| 2004/0096023 A1 | 5/2004 | Bourdeau | |
| 2006/0026659 A1 | 2/2006 | McMullin et al. | |
| 2006/0039506 A1* | 2/2006 | D'Alessandro | 375/324 |
| 2006/0078058 A1* | 4/2006 | Lin | 375/260 |

FOREIGN PATENT DOCUMENTS

| | | |
|---|---|---|
| WO | WO 2004/047411 A1 | 6/2004 |
| WO | WO 2004047411 A1 * | 6/2004 |

* cited by examiner

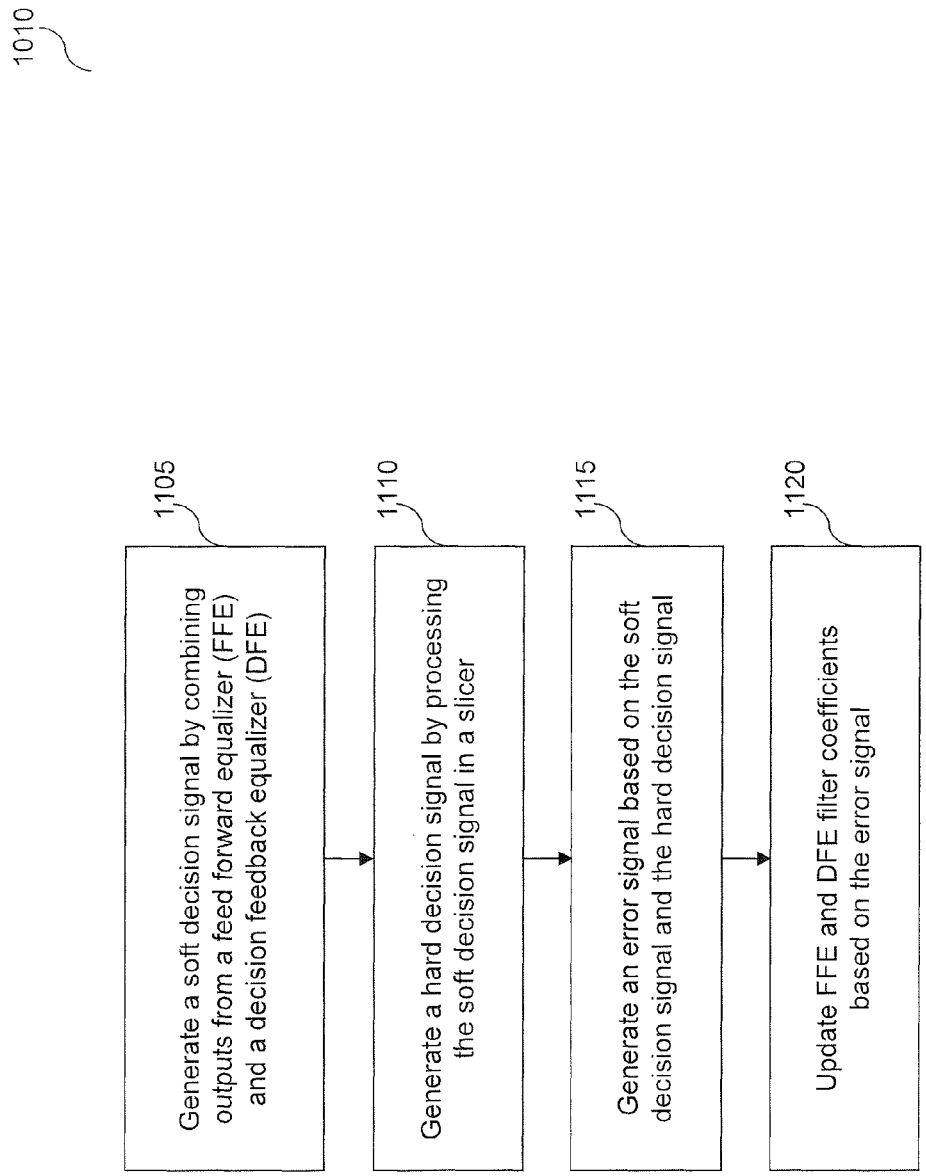

APPARATUS AND METHOD FOR CORRECTING IQ IMBALANCE

CROSS REFERENCE TO RELATED APPLICATIONS

This application claims the benefit of U.S. Provisional Application No. 60/661,165, entitled APPARATUS AND METHOD FOR CORRECTING IQ IMBALANCE, filed Mar. 14, 2005, which is herein incorporated by reference in its entirety.

BACKGROUND OF THE INVENTION

1. Field of the Invention

The invention relates generally to communication systems and, more particularly, to correcting in-phase (I) and quadrature-phase (Q) imbalances in a receiver.

2. Related Art

IQ imbalances are a problem for conventional receivers that generate separate I and Q output signals. IQ imbalances can be caused by non-identical I and Q paths in such receivers. For example, factors such as local oscillator quadrature mismatch, gain and phase mismatch in amplifiers, and filters and analog-to-digital converters (ADC) in the I and Q paths can all contribute to IQ imbalances. The IQ imbalances can be frequency-dependent imbalances (i.e., that vary with frequency) or frequency-independent/direct current (DC) imbalances (i.e., that do not vary with frequency). Uncorrected, IQ imbalances can cause signal detection errors, which detrimentally impact receiver performance.

What is needed, therefore, is an apparatus and method for correcting frequency-dependent and frequency-independent IQ imbalances in a receiver.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention. The drawing in which an element first appears is typically indicated by the leftmost digit(s) in the corresponding reference number.

FIGS. 8-11 show process flowcharts providing example steps for correcting IQ imbalance in a receiver in accordance with one or more embodiments of the present invention.

DETAILED DESCRIPTION OF THE INVENTION

Overview

Figure 1:
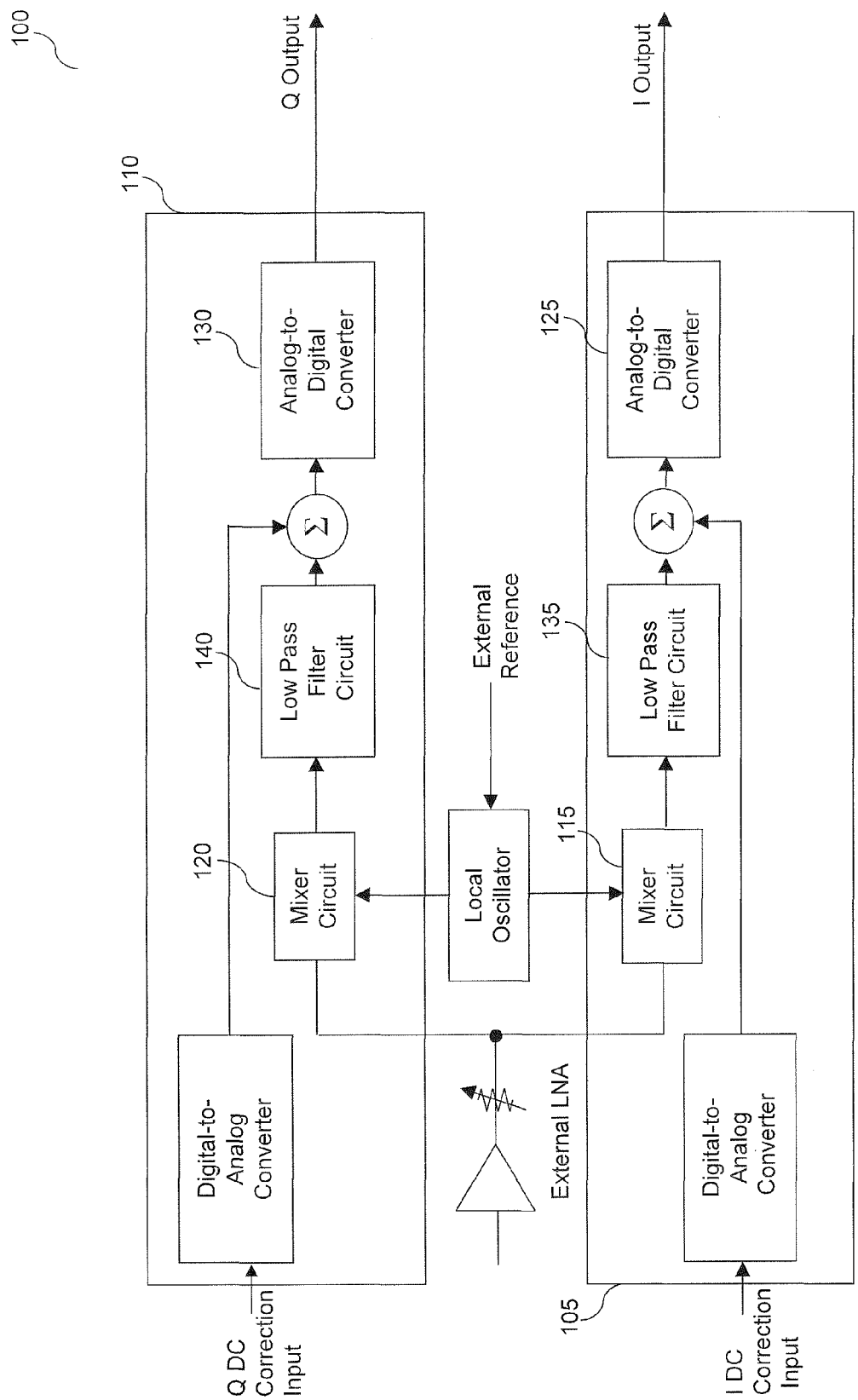
FIG. 1 illustrates a block diagram of an exemplary IQ baseband analog tuner having I and Q signal paths.

In a first exemplary embodiment of the present invention, a receiver for processing I and Q signals from a tuner includes: a non-decision directed (NDD) imbalance canceller coupled to receive the I and Q signals, and a decision directed (DD) imbalance canceller coupled to the non-decision directed imbalance canceller. The DD imbalance canceller converges after the NDD imbalance canceller converges so as to correct IQ imbalances in the receiver. In an embodiment, the receiver further corrects intersymbol interference.

In another embodiment, the NDD imbalance canceller corrects a majority of the IQ imbalances, and the DD imbalance canceller corrects a remainder of the IQ imbalances not previously corrected by the NDD imbalance canceller. The IQ imbalances can include frequency-dependent IQ imbalances and frequency-independent IQ imbalances.

In yet another embodiment, the majority of the IQ imbalances includes frequency-independent IQ imbalances. The frequency-independent IQ imbalances can include gain IQ imbalances and phase IQ imbalances. The phase IQ imbalances can include sampling IQ imbalances.

In still yet another embodiment, the remainder of the IQ imbalances includes frequency-dependent IQ imbalances. The frequency-dependent IQ imbalances can include filter IQ imbalances associated with filters in I and Q paths of the tuner.

In a further embodiment, the NDD imbalance canceller includes an equalizer. In a still further embodiment, the DD imbalance canceller includes an equalizer. The equalizer of the DD imbalance canceller includes: a feed-forward equalizer (FFE), a decision feedback equalizer (DFE) coupled to the FFE, an error generator circuit that generates an error signal, and a coefficient update circuit that updates FFE and DFE filter coefficients based on the error signal. The error generator circuit includes: a first summer that combines outputs from the FFE and the DFE to generate a soft decision signal, a slicer that processes the soft decision signal to generate a hard decision signal, and a second summer that combines the soft decision signal and the hard decision signal to generate the error signal. The FFE and the DFE can each include a plurality of finite impulse response filters (FIRs). In particular, the FFE and the DFE can each include four FIRs.

In a second exemplary embodiment of the present invention, a method for processing I and Q signals from a tuner includes: (a) converging a NDD imbalance canceller to correct a majority of IQ imbalances, and (b) subsequently converging a DD imbalance canceller to correct a remainder of the IQ imbalances not corrected in step (a).

In an embodiment, step (a) includes converging the NDD imbalance canceller to correct frequency-independent IQ imbalances. Correcting frequency-independent IQ imbalances can include correcting gain IQ imbalances and phase IQ imbalances. Correcting phase IQ imbalances can include correcting sampling IQ imbalances. Step (a) can further include correcting the gain IQ imbalances by subtracting a Q signal power from an I signal power and converging the difference, and correcting the phase IQ imbalances by multiplying the I signal by the Q signal and converging an expected value of the product.

In another embodiment, step (b) includes converging the DD imbalance canceller to correct frequency-dependent IQ imbalances. Correcting frequency-dependent imbalances can include correcting filter IQ imbalances associated with filters in I and Q paths of the tuner. In yet another embodiment, step (b) includes converging the DD imbalance canceller to correct intersymbol interference.

In still yet another embodiment, step (b) includes: (i) converging the DD imbalance canceller in a constant modulus algorithm (CMA) mode, and (ii) subsequently converging the DD imbalance canceller in an asymmetric mode. Step (ii) can include: generating a soft decision signal by combining outputs from a FFE and a DFE; generating a hard decision signal by processing the soft decision signal in a slicer; generating an error signal based on the soft decision signal and the hard decision signal; and updating FFE and DFE filter coefficients based on the error signal.

This specification discloses one or more embodiments that incorporate the features of this invention. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

The apparatus and method of the present invention described herein are advantageous because they improve receiver performance by correcting frequency-dependent and frequency-independent IQ imbalances. Additional features of the methods and systems of the present invention are described below in more detail.

Exemplary IQ Imbalance Models

FIG. 1 illustrates a block diagram of an exemplary IQ baseband analog tuner 100 having an I signal path 105 and a Q signal path 110. Among other components, tuner 100 includes a mixer circuit 115, a low-pass filter circuit 135, and an analog-to-digital converter (ADC) 125 in I path 105, and a mixer circuit 120, a low-pass filter circuit 140, and an ADC 130 in Q path 110. Because the components in I and Q paths 105 and 110 cannot be designed to be identical, tuner 100 produces IQ imbalances.

In general, any source of difference between I and Q paths 105 and 110 will contribute to IQ imbalances in tuner 100. Three types of frequency-independent IQ imbalances include phase imbalance, gain imbalance, and timing phase imbalance, which is also referred to herein as sampling imbalance. For example, differences between a mixer in mixer circuit 115 of I path 105 and a mixer in mixer circuit 120 of Q path 110 cause a phase imbalance in tuner 100. Similarly, differences in gain attributed to I and Q paths 105 and 110 cause a gain imbalance in tuner 100. Furthermore, when ADC 125 in I path 105 is not clocked at the same time as ADC 130 in Q path 110, tuner 100 also suffers from a sampling imbalance. As indicated above, the phase, gain, and sampling imbalances are frequency-independent IQ imbalances, and are therefore the same across all frequencies.

One type of frequency-dependent IQ imbalance includes filter imbalance. For example, differences between a filter in low-pass filter circuit 135 of I path 105 and a filter in low-pass filter circuit 140 of Q path 110 cause a filter imbalance in tuner 100. Frequency-dependent IQ imbalances, such as filter imbalances, vary according to frequency.

Figure 2A:
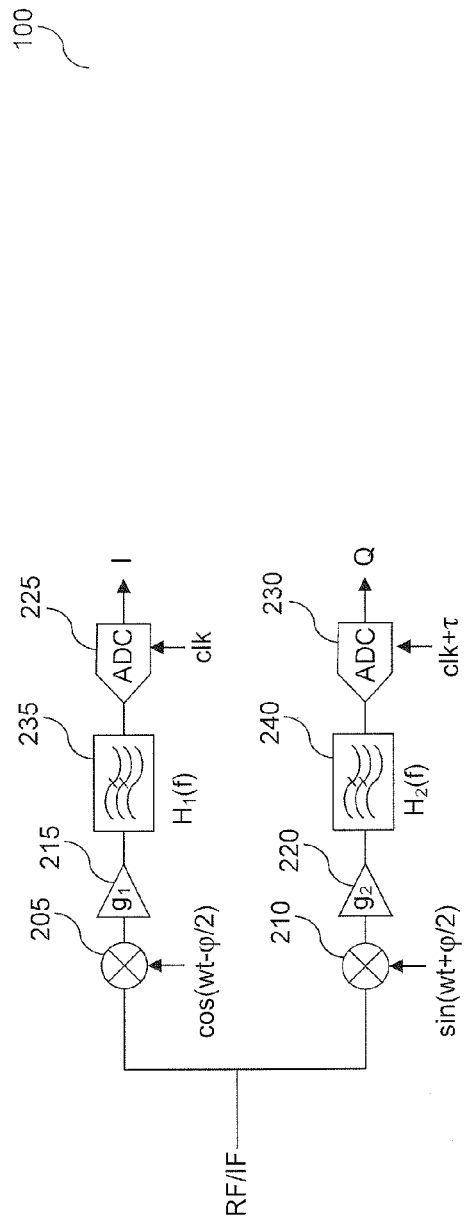
FIG. 2A illustrates a simplified block diagram of the tuner of FIG. 1.

A simplified block diagram of tuner 100 is shown in FIG. 2A. A phase imbalance $\phi$ is due to imperfect quadrature mix of I and Q mixers 205 and 210. A gain imbalance g is due to non-matching analog I and Q gain stages 215 and 220. A sampling imbalance $\tau$ is due to a temporal offset in sampling of I and Q ADCs 225 and 230. Finally, a filter imbalance H(f) is due to variations in I and Q filters 235 and 240.

Figure 2B:
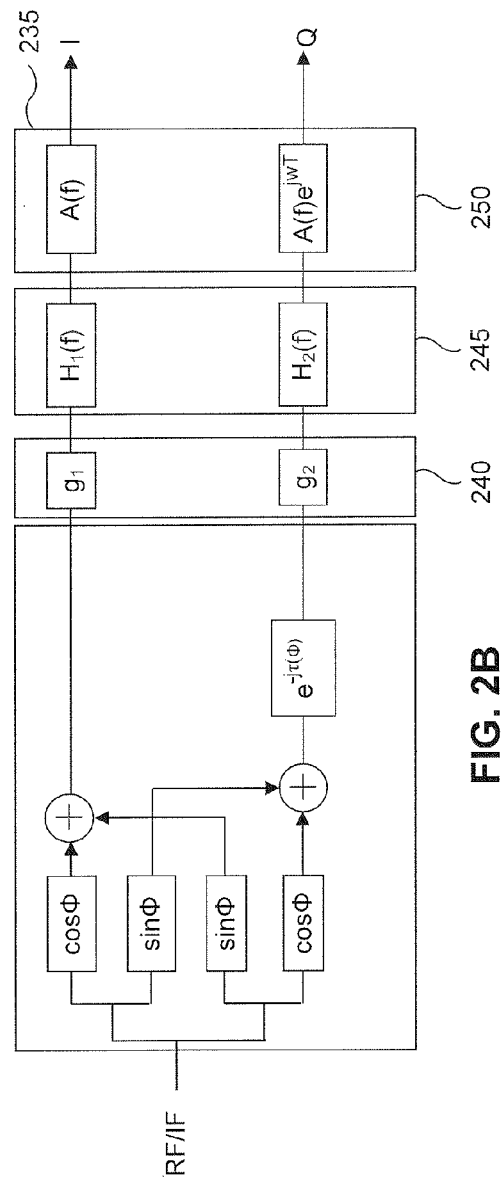
FIG. 2B illustrates an equivalent filter representation of FIG. 2A.

FIG. 2B shows an equivalent filter representation of the simplified block diagram of tuner 100 shown in FIG. 2A. Phase imbalance $\phi$ is represented by a two-port/two-port filter 235 that includes sin($\phi$) and cos($\phi$) functions. Gain imbalance g is represented by multipliers 240, and filter imbalance H(f) is represented by filters 245. Sampling imbalance $\tau$ is represented by an all-pass function 250 with delay $\tau$. The effect of sampling balance $\tau$ is essentially a part of phase imbalance $\phi$ model 235. Thus, sampling imbalance $\tau$ is typically lumped together and treated as part of phase imbalance $\phi$.

Figure 3:
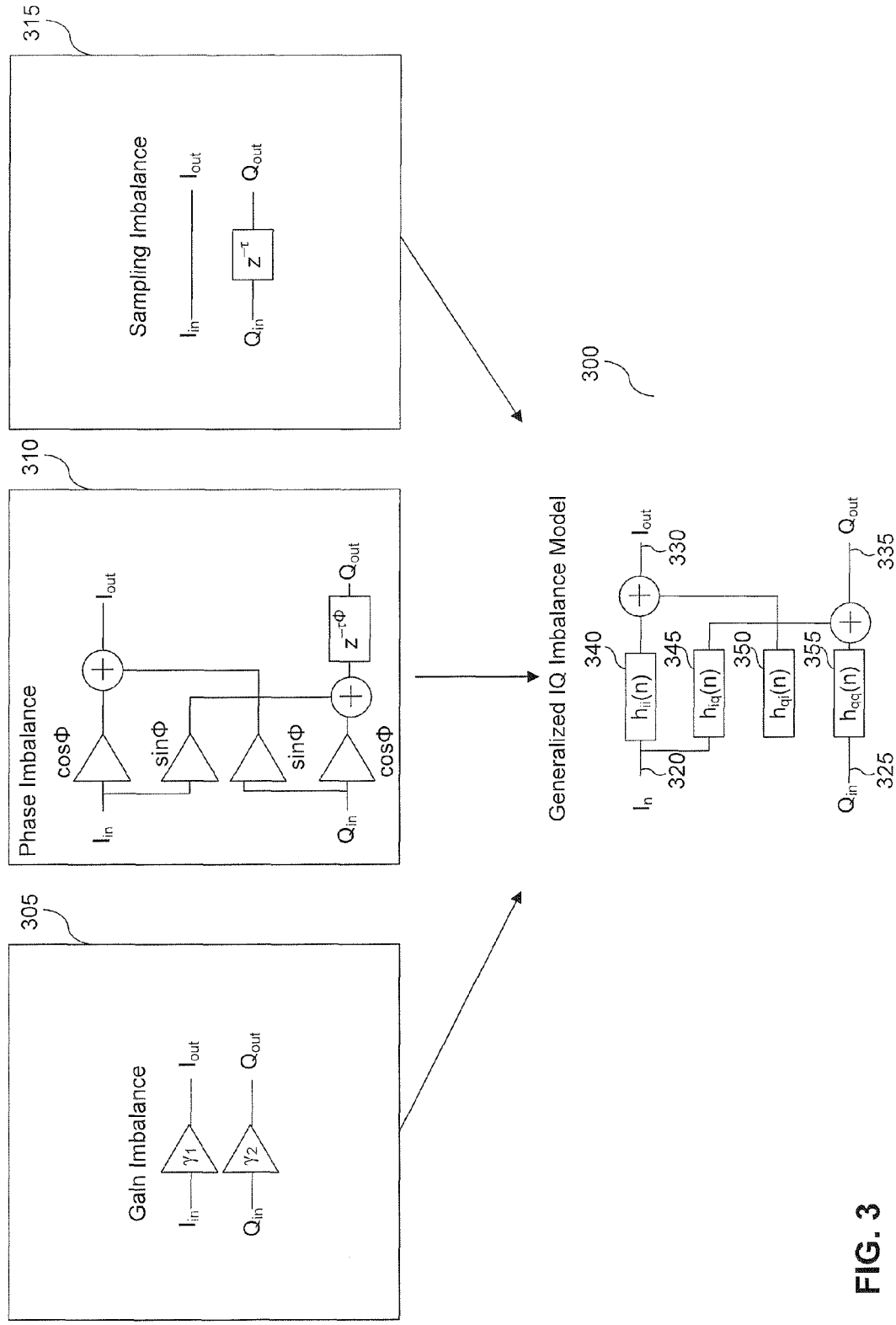
FIG. 3 illustrates a two-port/two-port generalized IQ imbalance model incorporating three frequency-independent IQ imbalance models.

FIG. 3 shows a two-port/two-port generalized IQ imbalance model 300 incorporating three frequency-independent IQ imbalance models: a gain imbalance model 305, a phase imbalance model 310, and a sampling imbalance model 315. These three frequency-independent IQ imbalance models correspond to gain, phase, and sampling IQ imbalances described above in conjunction with FIGS. 2A and 2B. Generalized IQ imbalance model 300 includes two inputs 320 and 325 and two outputs 330 and 335. All possible combinations of inputs 320 and 325 are represented through four linear time-invariant filters 340, 345, 350, and 355. Example linear time-invariant filters include finite impulse response (FIR) and infinite impulse response (IIR) filters.

Exemplary Apparatus for Correcting IQ Imbalance

The apparatus and method for correcting IQ imbalance of the present invention is particularly useful in the environment of a communications receiver, for example, cable set-top box and cable modem receivers, as well as any radio frequency (RF)/intermediate frequency (IF) receivers that generate separate I and Q signal outputs.

Figure 4:
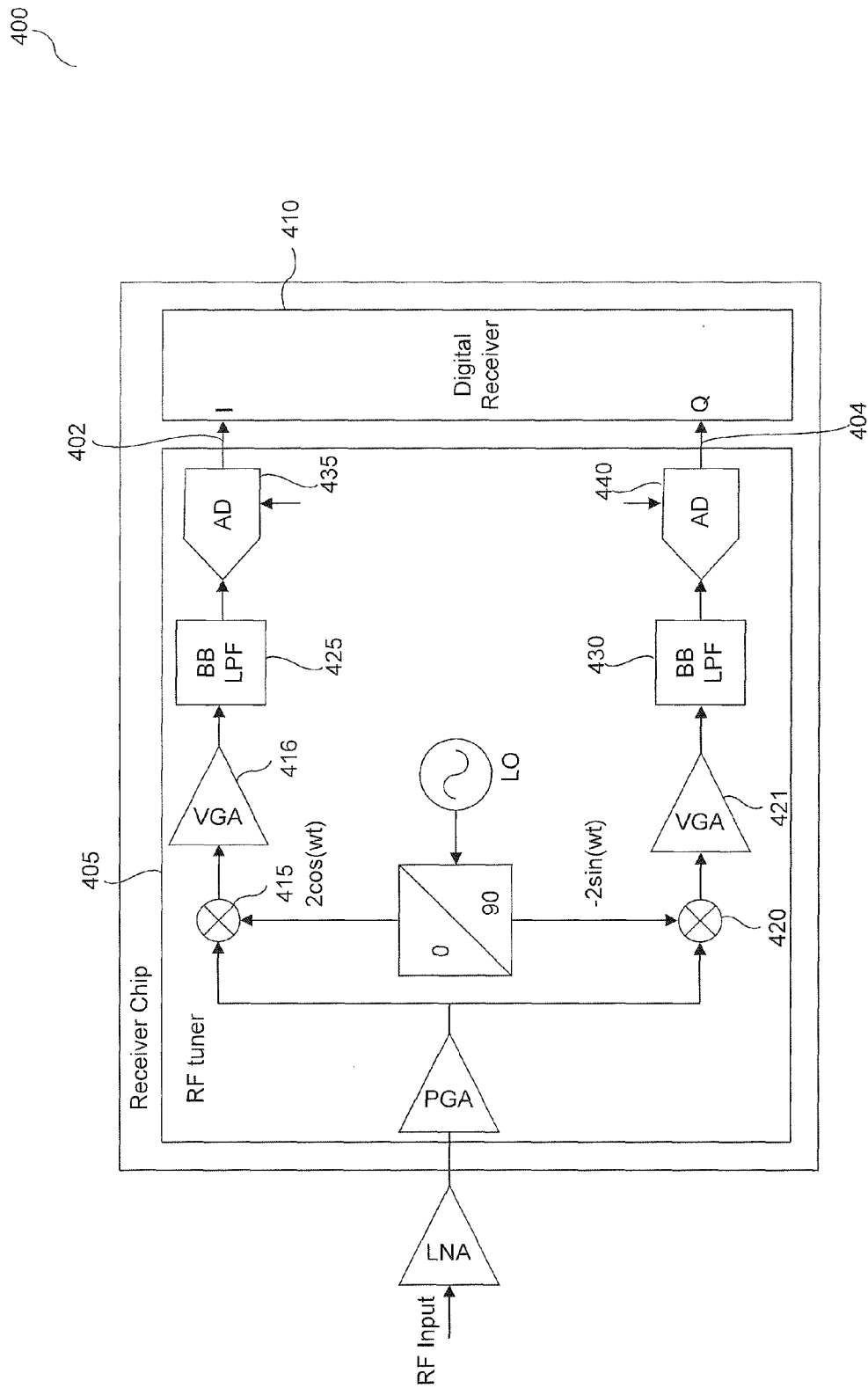
FIG. 4 illustrates an exemplary integrated receiver, having an analog RF tuner and a digital receiver.

FIG. 4 illustrates such an environment including the present invention. FIG. 4 shows a block diagram of an integrated receiver 400, having an analog RF tuner 405 and a digital receiver 410. RF tuner 405 and digital receiver 410 can be integrated on a single chip or on separate chips.

As shown in FIG. 4, RF tuner 405 includes mixers 415 and 420, variable gain amplifiers 416 and 421, low-pass filters 425 and 430, and ADCs 435 and 440, and generates an I signal output 402 and a Q signal output 404. As described above, differences between the components in the I and Q paths of RF tuner 405 will produce frequency-dependent and frequency-independent IQ imbalances. For example, local oscillator mismatch between mixers 415 and 420 produce a phase imbalance, non-matching amplifiers 416 and 421 produce a gain imbalance, and temporal offset in sampling of ADC 435 and ADC 440 produce a sampling imbalance. Furthermore, variations between filters 425 and 430 produce a filter imbalance. Digital receiver 410 receives I and Q signals 402 and 404 and corrects the aforementioned IQ imbalances produced by RF tuner 405.

Figure 5:
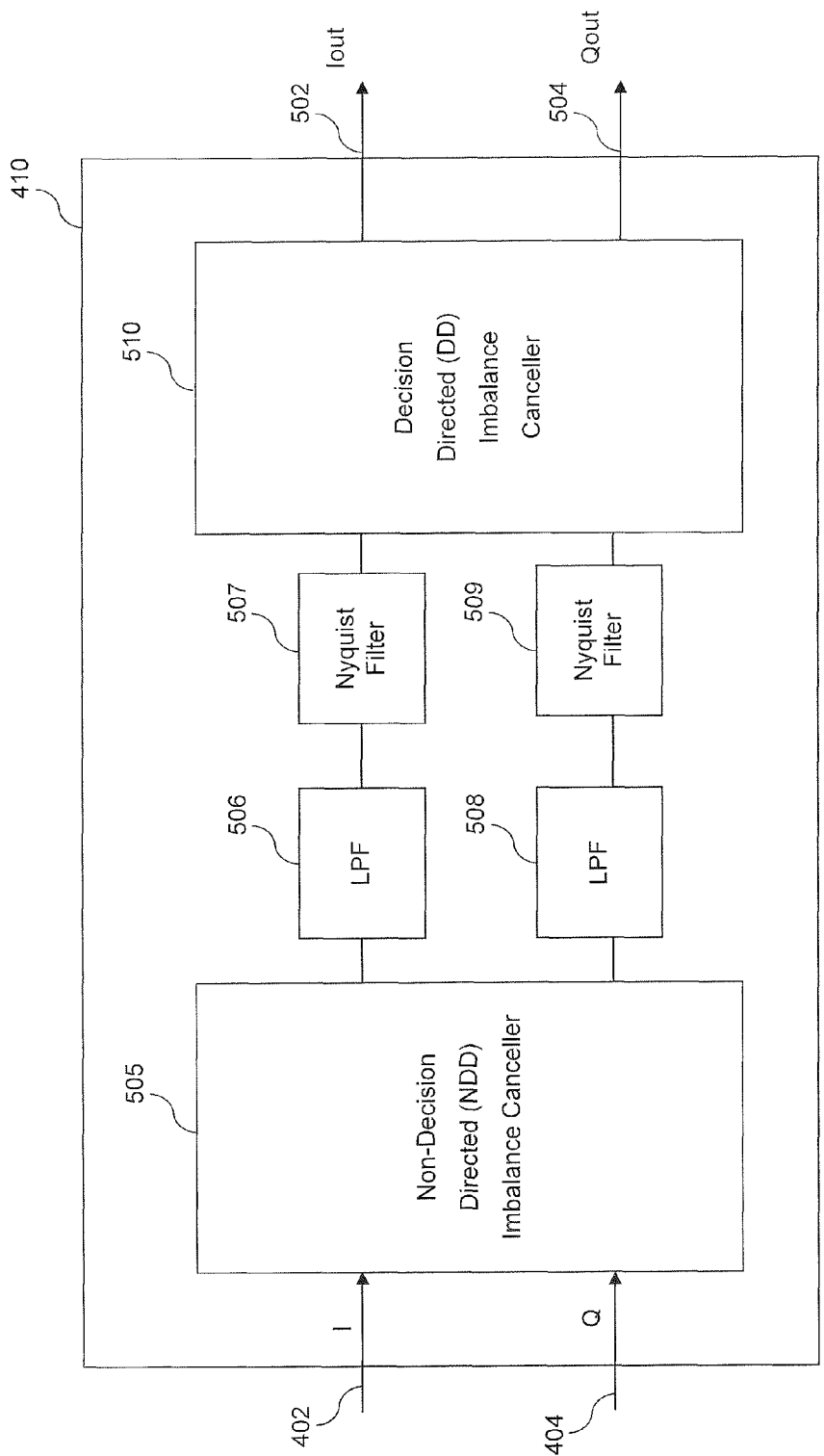
FIG. 5 illustrates a simplified block diagram of an exemplary digital receiver in accordance with an embodiment of the present invention.

FIG. 5 illustrates a simplified block diagram of digital receiver 410. Digital receiver 410 includes a non-decision directed (NDD) imbalance canceller 505, low-pass filters 506 and 508, Nyquist filters 507 and 509, and a decision directed (DD) imbalance canceller 510. Digital receiver 410 corrects the IQ imbalances produced by RF tuner 405, and generates I and Q output signals 502 and 504. Note that the techniques for correcting IQ imbalances described herein are not limited to the example configuration of digital receiver 410 shown in FIG. 5.

NDD imbalance canceller 505, also referred to herein as a DC IQ imbalance canceller, is configured to correct frequency-independent IQ imbalances only, such as the phase/sampling and gain imbalances, described above. As its name suggests, NDD imbalance canceller 505 uses non-decision directed cancellation techniques to converge (i.e., NDD imbalance canceller 505 converges without any assistance from symbol decisions).

DD imbalance canceller 510, also referred to herein as an asymmetric equalizer and phase derotator, is configured to correct any type of IQ imbalance, including frequency-dependent IQ imbalances, such as the filter imbalance described above. As its name suggests, DD imbalance canceller uses decision directed cancellation techniques to converge (i.e., DD imbalance canceller 510 relies on symbol decisions to converge). One such technique is a least mean square algorithm.

Even though DD imbalance canceller 510 is configured to correct any type of IQ imbalance (i.e., frequency-dependent and frequency-independent IQ imbalances), if a signal is severely corrupted by IQ imbalances, DD imbalance canceller 510 will not be able to converge. Thus, according to an embodiment of the present invention, NDD imbalance canceller 505 converges first, removing the frequency-independent IQ imbalances, such as phase/sampling and gain imbalances. Assuming a majority of the IQ imbalances produced by RF tuner 405 is frequency-independent IQ imbalances, DD imbalance canceller will be able to converge if NDD imbalance canceller 505 converges first.

In other words, after NDD imbalance canceller 505 corrects the majority of the IQ imbalances produced by RF tuner 405, the signal will be less-corrupted (i.e., the "eye" of a corresponding IQ diagram will be open), allowing DD imbalance canceller 510 to subsequently converge using decision directed techniques. DD imbalance canceller 510 will correct residual IQ imbalances not previously corrected by NDD imbalance canceller 505 (e.g., frequency-dependent IQ imbalances).

Figure 6:
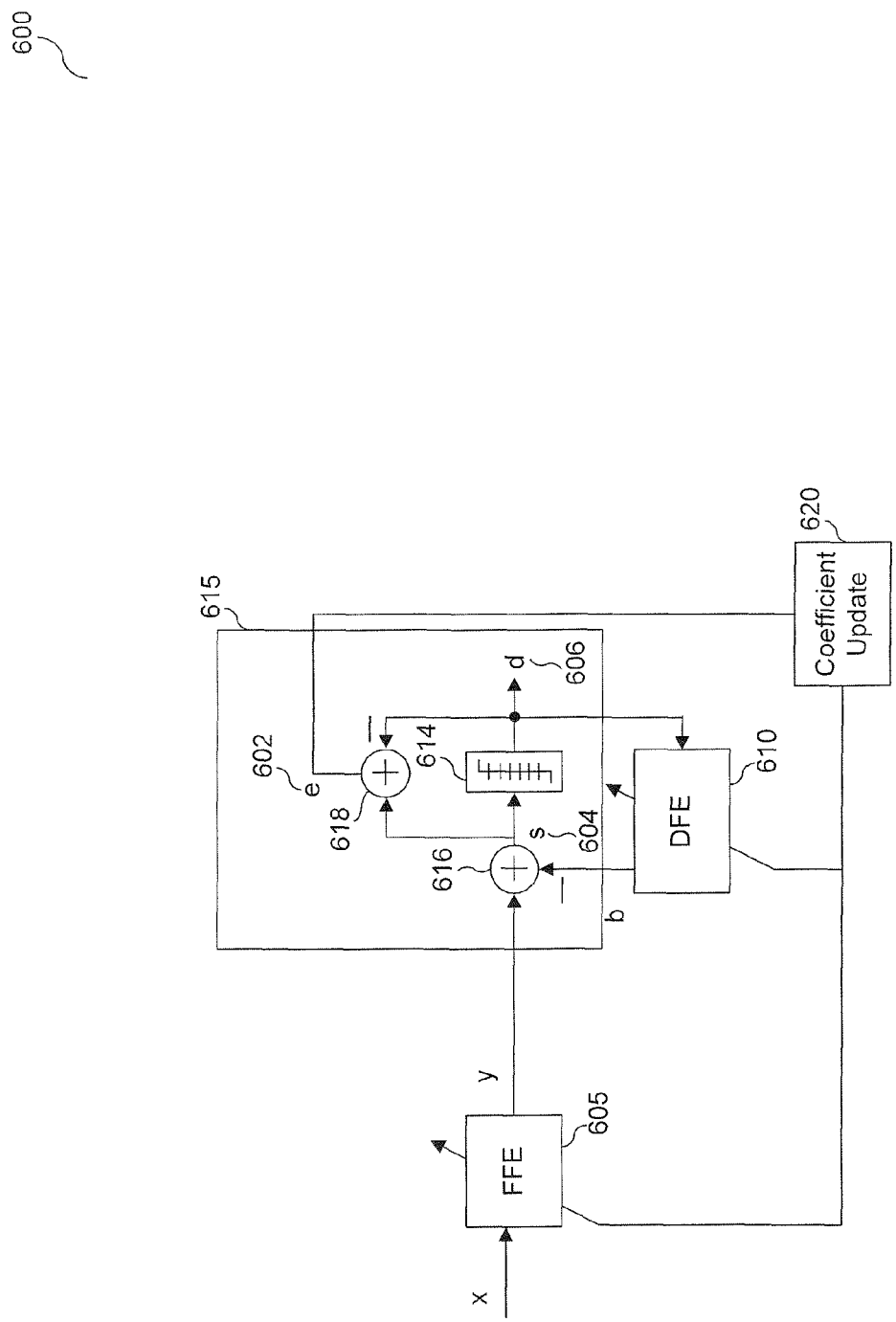
FIG. 6 illustrates a block diagram of an exemplary asymmetric equalizer.

In an embodiment, NDD imbalance canceller 505 is implemented as a DC equalizer. In another embodiment, DD imbalance canceller 510 is implemented as an asymmetric equalizer. FIG. 6 illustrates a block diagram of an example asymmetric equalizer 600. Asymmetric equalizer 600 includes a feed-forward equalizer (FFE) 605, a decision feedback equalizer (DFE) 610, an error generator circuit 615, and a coefficient update circuit 620. Error generator circuit 615 includes a first summer 616, a slicer 614, and a second summer 618.

An IQ signal $x = x_i + jx_q$ is fed into asymmetric equalizer 600. FFE 605 generates a signal $y = y_i + jy_q$ and DFE 610 generates a signal $b = b_i + jb_q$.

Error generator circuit 615 generates an error signal 602 based on a soft decision signal 604 and a hard decision signal 606. First summer 616 combines the outputs from FFE 605 and DFE 610 to form soft decision signal 604 as follows:

$$s = s_i + js_q = (y_i - b_i) + j(y_q - b_q) \quad (1)$$

Slicer 614 processes soft decision signal 604 to form hard decision signal 606 ($d = d_i + jd_q$). Second summer 618 combines soft decision signal 604 and hard decision signal 606 to generate error signal 602 as follows:

$$e = e_i + je_q = (s_i - d_i) + j(s_q - d_q) \quad (2)$$

Figure 7A:
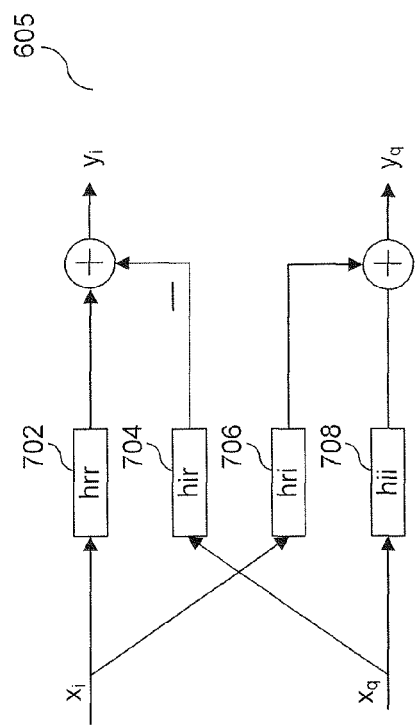
FIGS. 7A and 7B illustrate exemplary implementations of a feed forward equalizer (FFE) and a decision feedback equalizer (DFE), respectively.

In an embodiment, FFE 605 includes four finite-impulse-response (FIR) filters 702, 704, 706, and 708, as shown in FIG. 7A. Coefficient update circuit 620 updates coefficients of the four FIR filters of FFE 605 according to equations (3a)-(3d), where μ is the update step size (positive number between 0 and 1):

$$hrr(n) = hrr(n-1) - \mu e_i x_i \quad (3a)$$

$$hir(n) = hir(n-1) + \mu e_i x_q \quad (3b)$$

$$hri(n) = hri(n-1) - \mu e_q x_i \quad (3c)$$

$$hii(n) = hii(n-1) - \mu e_q x_q \quad (3d)$$

Figure 7B:
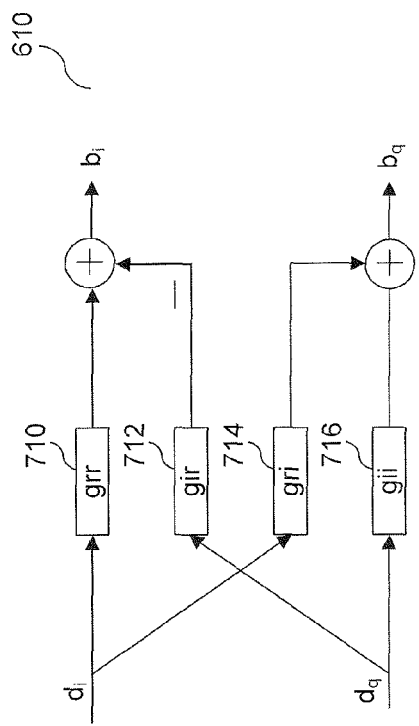

In another embodiment, DFE 610 also includes four FIR filters 710, 712, 714, and 716, as shown in FIG. 7B. Coefficient update circuit 620 updates the coefficients of the four FIR filters of DFE 610 according to equations (4a)-(4d), where μ is the update step size (positive number between 0 and 1):

$$grr(n) = grr(n-1) - \mu e_i d_i \quad (4a)$$

$$gir(n) = gir(n-1) + \mu e_i d_q \quad (4b)$$

$$gri(n) = gri(n-1) - \mu e_q d_i \quad (4c)$$

$$gii(n) = gii(n-1) - \mu e_q d_q \quad (4d)$$

In this way, asymmetric equalizer 600 converges to correct residual IQ imbalances. For example, when DD imbalance canceller 510 is implemented as asymmetric equalizer 600, asymmetric equalizer 600 converges to correct residual IQ imbalances not previously corrected by NDD imbalance canceller 505. In yet another embodiment, after NDD imbalance canceller 505 converges, the level of residual IQ imbalances should not exceed 35 dB signal-to-noise ratio (SNR) for DD imbalance canceller 510 (asymmetric equalizer 600) to converge using decision directed techniques.

Exemplary Method for Correcting IQ Imbalance

FIGS. 8-11 show process flowcharts providing example steps for correcting IQ imbalance in a receiver, according to one or more embodiments of the present invention. The steps of FIGS. 8-11 do not necessarily have to occur in the order shown, as will be apparent to persons skilled in the relevant art(s) based on the teachings herein. Other operational and structural embodiments will be apparent to persons skilled in the relevant art(s) based on the following discussion. These steps are described in detail below.

Figure 8:
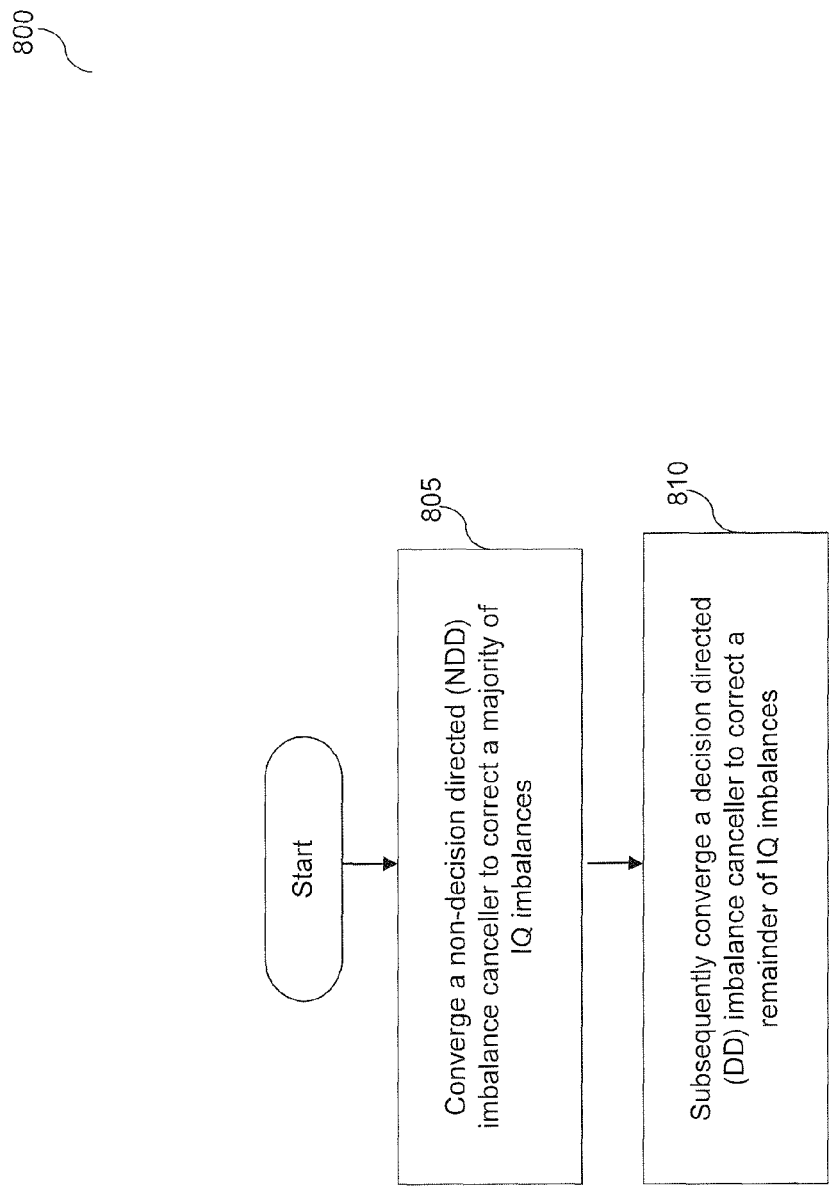

FIG. 8 shows a process flowchart 800 providing example high-level steps for processing I and Q signals from a tuner. In step 805, a NDD imbalance canceller converges to correct a majority of IQ imbalances. For example, the NDD imbalance canceller is NDD imbalance canceller 505, shown in FIG. 5, and converges on I and Q signals 402 and 404 to correct a majority of IQ imbalances produced by RF tuner 405. In an embodiment, step 805 includes correcting frequency-independent IQ imbalances. In another embodiment, correcting frequency-independent IQ imbalances includes correcting gain and phase IQ imbalances. In yet another embodiment, correcting phase IQ imbalances includes correcting sampling IQ imbalances.

In step 810, a DD imbalance canceller is subsequently converged to correct a remainder of IQ imbalances, not corrected in step 805. For example, the DD imbalance canceller is DD imbalance canceller 510, shown in FIG. 5, and corrects a remainder of IQ imbalances not previously corrected by NDD imbalance canceller 505. As described above, in order for DD imbalance canceller 510 to converge, a majority of the IQ imbalances are first corrected by NDD imbalance canceller 505 so that DD imbalance canceller 510 need only correct a remainder of IQ imbalances.

In an embodiment, step 810 includes converging the DD imbalance canceller to correct frequency-dependent IQ imbalances. In another embodiment, correcting frequency-dependent IQ imbalances includes correcting filter IQ imbalances associated with filters in I and Q paths of the tuner. For example, the DD imbalance canceller can correct filter IQ imbalances associated with filters 425 and 430 in the I and Q paths of RF tuner 405, shown in FIG. 4. In still yet another embodiment, step 810 further includes converging the DD imbalance canceller to correct intersymbol interference.

Figure 9:
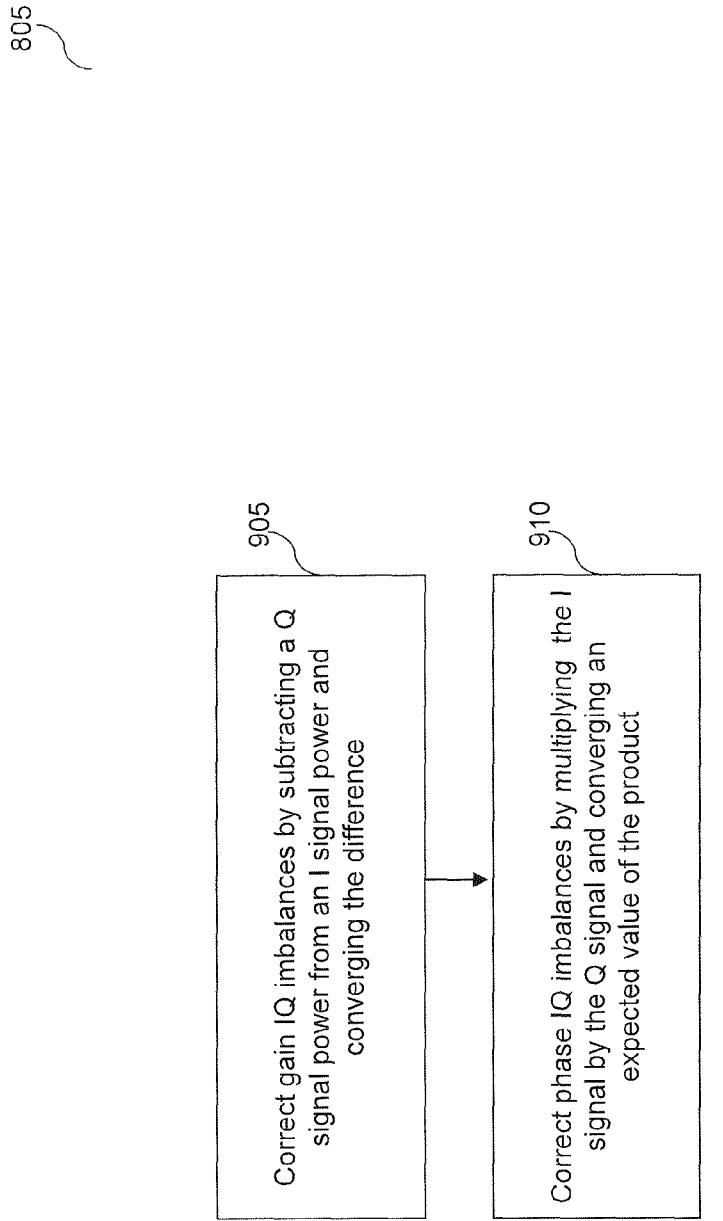

FIG. 9 provides optional steps for implementing step 805, shown in FIG. 8. In step 905, gain IQ imbalances are corrected by subtracting a Q signal power from an I signal power and converging the difference. For example, as shown below in equation (5), $E[i^2]$ represents the I signal power and $E[q^2]$ represents the Q signal power. Using a feedback loop, the I signal power and the Q signal power can be adjusted until the difference approaches zero.

$$DC \text{ gain imbalance canceller-error} = E[i^2] - E[q^2] \quad (5)$$

In step 910, phase IQ imbalances are corrected by multiplying the I signal by the Q signal and converging an expected value of the product. For example, as shown below in equation (6), $E[iq]$ represents the expected value of the product of the I signal and the Q signal. Again, using a feedback loop, the I signal and the Q signal can be adjusted until the expected value of the product approaches zero.

$$DC \text{ phase imbalance canceller-error} = E[iq] \quad (6)$$

Figure 10:
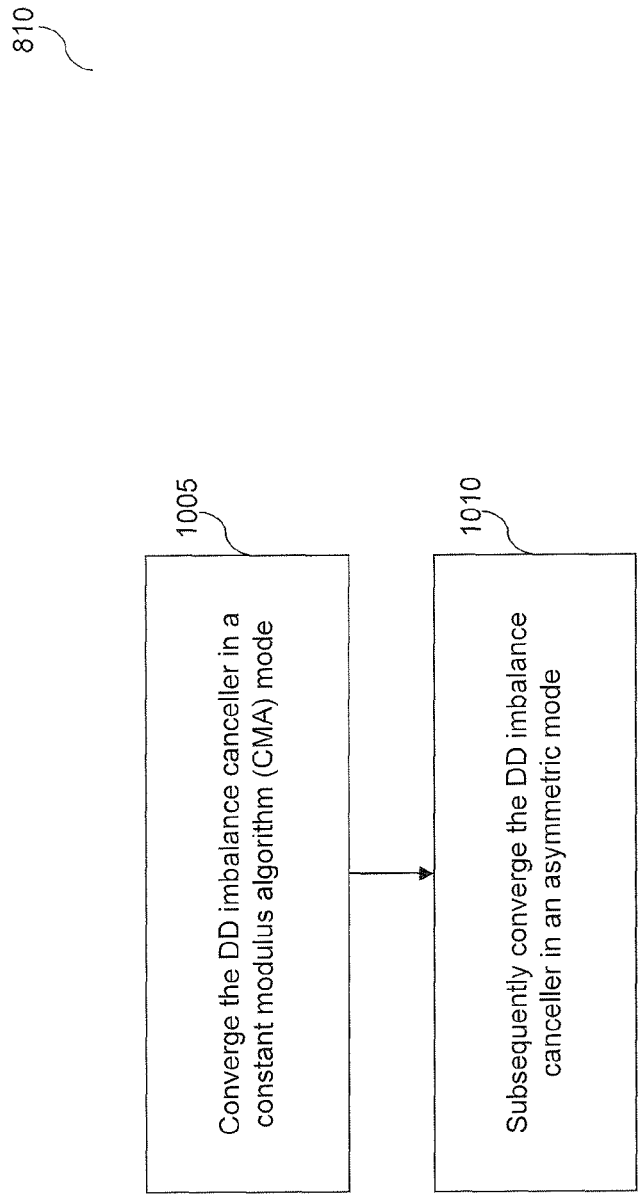

FIG. 10 provides optional steps for implementing step 810, shown in FIG. 8. In step 1005, the DD imbalance canceller initially converges in a constant modulus algorithm (CMA) mode. In step 1010, the DD imbalance canceller subsequently converges in an asymmetric mode to correct any remaining asymmetric distortion.

FIG. 11 provides optional steps for implementing step 1010, shown in FIG. 10. In step 1105, a soft decision signal is generated by combining outputs from a FFE and a DFE. For example, as described above in conjunction with asymmetric equalizer 600 shown in FIG. 6, first summer 616 of error generator 615 generates soft decision signal 604 by combining outputs from FFE 605 and DFE 610.

In step 1110, a hard decision signal is generated by processing the soft decision signal in a slicer. For example, as described above in conjunction with FIG. 6, slicer 614 of error generator 615 processes soft decision signal 604 and outputs hard decision signal 606.

In step 1115, an error signal is generated based on the soft decision signal and the hard decision signal. For example, as described above in conjunction with FIG. 6, second summer 618 of error generator 615 combines soft decision signal 604 and hard decision signal 606 to generate error signal 602.

In step 1120, the FFE and DFE filter coefficients are updated based on the error signal. For example, as described above in conjunction with FIG. 6, coefficient update circuit 620 updates filter coefficients for FFE 605 and DFE 610. As shown in FIGS. 7A and 7B, FFE 605 and DFE 610 can each be implemented with FIR filters.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A receiver for processing I and Q signals from a tuner, comprising:
   a non-decision directed (NDD) imbalance canceller, coupled to receive the I and Q signals, configured to correct frequency-independent IQ imbalances and to converge independent of symbol decisions; and
   a decision directed (DD) imbalance canceller, coupled to the NDD imbalance canceller, configured to correct frequency-dependent IQ imbalances and to converge based on symbol decisions after the NDD imbalance canceller converges, so as to correct IQ imbalances in the receiver.

2. The receiver of claim 1, wherein the NDD imbalance canceller is configured to correct a majority of the IQ imbalances, and wherein the DD imbalance canceller is configured to correct a remainder of the IQ imbalances not previously corrected by the NDD imbalance canceller.

3. The receiver of claim 2, wherein the IQ imbalances comprise:
   frequency-dependent IQ imbalances and frequency-independent IQ imbalances.

4. The receiver of claim 3, wherein the majority of the IQ imbalances comprises:
   the frequency-independent IQ imbalances.

5. The receiver of claim 4, wherein the frequency-independent IQ imbalances comprise:
   gain IQ imbalances and phase IQ imbalances.

6. The receiver of claim 5, wherein the phase IQ imbalances comprise:
   sampling IQ imbalances.

7. The receiver of claim 3, wherein the remainder of the IQ imbalances comprises:
   frequency-dependent IQ imbalances.

8. The receiver of claim 7, wherein the frequency-dependent IQ imbalances comprise:
   filter IQ imbalances associated with filters in I and Q paths of the tuner.

9. The receiver of claim 1, wherein the NDD imbalance canceller comprises:
   an equalizer.

10. The receiver of claim 1, wherein the DD imbalance canceller comprises:
    an equalizer.

11. The receiver of claim 10, wherein the equalizer comprises:
    a feed-forward equalizer (FFE);
    a decision feedback equalizer (DFE) coupled to the FFE;
    an error generator circuit configured to generate an error signal, wherein the error generator circuit includes:
    a first summer configured to combine outputs from the FFE and the DFE to generate a soft decision signal,
    a slicer configured to process the soft decision signal to generate a hard decision signal, and
    a second summer configured to combine the soft decision signal and the hard decision signal to generate the error signal; and
    a coefficient update circuit that configured to update FFE and DFE filter coefficients based on the error signal.

12. The receiver of claim 11, wherein the FFE and the DFE each comprise:
    a plurality of finite impulse response filters.

13. The receiver of claim 11, wherein the FFE and the DFE each comprise:
    four finite impulse response filters.

14. The receiver of claim 1, wherein the receiver is further configured to correct intersymbol interference.

15. A method for processing I and Q signals from a tuner, comprising:
   (a) converging a non-decision directed (NDD) imbalance canceller independent of symbol decisions to correct a majority of IQ imbalances that include frequency-independent IQ imbalances; and
   (b) subsequently converging a decision directed (DD) imbalance canceller based on symbol decisions to correct a remainder of IQ imbalances not corrected in step (a) that include frequency-dependent IQ imbalances.

16. The method of claim 15, wherein the frequency-independent IQ imbalances comprise:
   gain IQ imbalances and phase IQ imbalances.

17. The method of claim 16, wherein the phase IQ imbalances comprise:
   sampling IQ imbalances.

18. The method of claim 16, wherein step (a) comprises:
   (a)(i) correcting the gain IQ imbalances by subtracting a Q signal power from an I signal power and converging the difference; and
   (a)(ii) correcting the phase IQ imbalances by multiplying the I signal by the Q signal and converging an expected value of the product.

19. The method of claim 15, wherein the frequency-dependent IQ imbalances comprise:
   filter IQ imbalances associated with filters in I and Q paths of the tuner.

20. The method of claim 15, wherein step (b) comprises:
   (b)(i) converging the DD imbalance canceller to correct intersymbol interference.

21. The method of claim 15, wherein step (b) comprises:
   (b)(i) converging the DD imbalance canceller in a constant modulus algorithm (CMA) mode; and
   (b)(ii) subsequently converging the DD imbalance canceller in an asymmetric mode.

22. The method of claim 21, wherein step (b)(ii) comprises:
   (b)(ii)(A) generating a soft decision signal by combining outputs from a feed forward equalizer (FFE) and a decision feedback equalizer (DFE);
   (b)(ii)(B) generating a hard decision signal by processing the soft decision signal in a slicer;
   (b)(ii)(C) generating an error signal based on the soft decision signal and the hard decision signal; and
   (b)(ii)(D) updating FFE and DFE filter coefficients based on the error signal.

23. The receiver of claim 1, further comprising:
   a summer configured to combine outputs from a feed forward equalizer (FFE) and a decision feedback equalizer (DFE) to generate a soft decision signal, the DD imbalance canceller being configured to converge based on symbol decisions of the soft decision signal.

24. The method of claim 15, further comprising:
   (c) combining outputs from a feed forward equalizer (FFE) and a decision feedback equalizer (DFE) to generate a soft decision signal, and wherein step (b) comprises:
   (b)(i) subsequently converging the DD imbalance canceller based on symbol decisions of the soft decision signal to correct the remainder of IQ imbalances.

\* \* \* \* \*